(12) United States Patent
Stessin

(10) Patent No.: US 9,064,864 B1
(45) Date of Patent: Jun. 23, 2015

(54) SEMICONDUCTOR DEVICE

(71) Applicant: Lev Stessin, Ashkelon (IL)

(72) Inventor: Lev Stessin, Ashkelon (IL)

(73) Assignee: VISIC TECHNOLOGIES LTD., Rehovot (IL)

( * ) Notice: Subject to any disclaimer, the term of this patent is extended or adjusted under 35 U.S.C. 154(b) by 0 days.

(21) Appl. No.: 14/142,979

(22) Filed: Dec. 30, 2013

(51) Int. Cl.
*H01L 29/745* (2006.01)
*H01L 21/336* (2006.01)
*H01L 23/50* (2006.01)

(52) U.S. Cl.
CPC ...................................... *H01L 23/50* (2013.01)

(58) Field of Classification Search
CPC .. B82Y 10/00; H01L 29/785; H01L 29/0657; H01L 29/6659; H01L 29/7833; H01L 27/14887; H01L 27/14831; H01L 29/66878; H01L 29/42316; H01L 29/665; H01L 29/66659; H01L 29/7835; G01N 27/414
USPC ......... 257/213, 222, 223, 229, 288, 414, 618; 438/179, 197, 286
See application file for complete search history.

(56) References Cited

U.S. PATENT DOCUMENTS

| 7,417,257 | B2 | 8/2008 | Beach et al. | |
|---|---|---|---|---|
| 8,637,905 | B2 * | 1/2014 | Zhang | 257/194 |
| 2002/0180005 | A1 * | 12/2002 | Haematsu | 257/621 |
| 2007/0108617 | A1 | 5/2007 | Heiling et al. | |

FOREIGN PATENT DOCUMENTS

| EP | 0725445 A1 | 8/1996 |
|---|---|---|
| EP | 2477228 A1 | 8/2012 |

OTHER PUBLICATIONS

PCT International Search Report dated Sep. 1, 2014 for application No. PCT/IL2013/051082, 9 pages.

* cited by examiner

*Primary Examiner* — Hsien Ming Lee
(74) *Attorney, Agent, or Firm* — A.C. Entis-IP Ltd.

(57) ABSTRACT

An embodiment of the invention relates to a semiconductor device comprising: first and second electrodes comprising first and second busbars respectively that decrease in cross section in opposite directions; and a plurality of interleaving first and second conducting fingers that extend from the first and second busbars respectively.

20 Claims, 4 Drawing Sheets

SEMICONDUCTOR DEVICE

FIELD

Embodiments of the invention relate to the structure of semiconductor devices ("SDs").

BACKGROUND

Various SDs, such as diodes and field effect transistors ("FETs"), may be operable to selectively be in an ON or OFF state. The SD may comprise a first electrode and a second electrode that are conductively connectable through an intervening semiconductor component, which has a relatively low resistance when the SD is in the ON state and a relatively high resistance when the SD is in the OFF state. Accordingly, the SD is capable of passing an "ON current" through the first and second electrodes when in the ON state, but not when in the OFF state. For example, where the SD is a diode that is forward biased, the diode is in the ON state and operable to pass the ON current between the first electrode (anode) and the second electrode (cathode) through the intervening and appropriately configured semiconductor component. In another example, where the SD is a FET with an appropriate voltage applied to a third electrode that serves as a gate electrode, the FET is operable to pass the ON current between the first electrode (source) and the second electrode (drain) through the intervening and appropriately configured semiconductor component. The electrodes may be formed on one or more epitaxial layers ("layers") grown on the substrate. It will be appreciated that a structure that is formed or situated "on" the substrate may be formed on one of the epitaxial layers and not be in direct contact with the substrate itself. Further, the semiconductor components through which the ON current passes may include a portion of the one or more epitaxial layers grown on the semiconductor substrate, with the layers being appropriately configured as needed. For convenience of presentation, "semiconductor substrate" or "substrate", as used herein, may include the one or more epitaxial layers.

As SDs are reduced in size to achieve higher concentrations of devices having smaller die areas and circuits with smaller cross-sections, current densities through those circuits tend to increase. Current density is commonly expressed as current per cross-sectional area, for example in the unit of Ampere/mm$^2$. In SDs, electrodes are formed as patterned thin metal layers, which may be of substantially uniform thickness. Further, current flow may preferentially occur at or near the surface of the electrodes, especially when the currents are operating under high frequencies. Thus, current density in the context of SD circuits may be expressed as current per cross-sectional width, for example in the unit of Ampere/mm$^2$. The increased current densities tend to make the SDs more susceptible to damage due to Ohmic overheating. Increased current density may also cause electromigration in which a portion of the electrodes is dislodged as a result of momentum transfer to the electrode from conducting electrons, leading eventually to malfunction or failure of the electrodes. In addition, uneven distribution of current through the SD may reduce the overall current that a SD can safely pass because the unevenness creates pockets of overly high current density.

SUMMARY

An aspect of an embodiment of the invention is to provide a SD, for example a diode or a FET, having electrodes for passing an ON current, the electrodes being configured to mitigate unevenness in current density along the path of the ON current.

According to an embodiment of the invention, there is provided a SD, hereinafter referred to as a "comb electrode SD", that includes first and second "comb electrodes" having first and second busbars, respectively, which decrease in cross section in opposite directions. The first and second comb electrodes further comprise a plurality of first and second interleaving conductive fingers that extend from the first and second busbars, respectively. When the comb electrode SD is in the ON state, the first and second comb electrodes may be conductively connected through their respective conductive fingers and intervening semiconductor components, with the interface between the first and second conducting fingers defining a perimeter available for current flow between the first and second conducting fingers.

The comb electrode SD is operable to pass an ON current between a terminal ("first terminal") of the first comb electrode and a terminal ("second terminal") of the second comb electrode. Depending on the configuration of the comb electrode SD, the ON current may flow from the first terminal to the second terminal, or in the other direction from the second terminal to the first terminal. Further, the magnitude of the ON current through the busbars may change along the length of the respective busbars, as the current is transferred between the first and second conductive fingers. In accordance with an embodiment of the invention, the cross section of each busbar decreases as it extends away from its respective terminal. In the context of the ON current flowing from the terminal of the first comb electrode to the terminal of the second comb electrode, the first busbar cross-section decreases relative to the direction of ON current flow while the cathode busbar cross-section increases relative to the direction of ON current flow.

According to an embodiment of the invention, the first and second busbars may be configured to mitigate changes in current density along length of the busbars despite changes in overall current. In certain embodiments of the invention, along the length of the busbar, the busbar cross section may be substantially proportional to the magnitude of ON current. In such a proportional configuration, changes in current density along length of the busbars may be substantially eliminated despite changes in overall current. In certain embodiments of the invention, the current density may be substantially constant along the length of the busbars.

In certain embodiments of the invention, at each point along the longitudinal axes of the two busbars, the sum of the cross section of the anode busbar and the cross section of the cathode busbar remains substantially constant. In certain embodiments of the invention, the cross section of the busbars may change linearly at a rate that is inversely proportional to each other.

In accordance with an embodiment of the invention, the sides of the first and second busbar facing each other may be substantially parallel with each other. In certain embodiments of the invention, the first and second busbars may be arranged with respect to each other in a tongue in groove configuration, in which one of the electrodes comprises two busbar arms that lie on both sides of, and "embrace", a single central busbar of the other electrode. Optionally, the first and second conductive fingers may be substantially parallel with each other. Optionally, the first and second conductive fingers may interleave in the intervening space between the first and second busbars. Optionally, the first and second conductive fingers may have substantially the same length.

In accordance to an embodiment of the invention, the first and second comb electrodes, including the respective terminals, busbars and conductive fingers do not overlap. In certain embodiments of the invention, the first and second comb electrodes are formed on a same epitaxial layer of the semiconductor substrate.

According to an embodiment of the invention, the comb electrode SD may further include a third comb electrode comprising a plurality of third conductive fingers commonly connected to a third busbar that extends from a third terminal. The third conductive fingers are arranged so that each third conductive finger is situated between one first conductive finger and one second conductive finger.

According to an embodiment of the invention, the comb electrode SD having the first and second comb electrodes may be a lateral diode ("comb diode"), with the first comb electrode being an anode and the second comb electrode being a cathode. Alternatively, the comb electrode SD may be a lateral FET ("comb FET"), with the first comb electrode being a source, the second electrode being a drain that further includes a gate electrode, which may optionally be the third electrode.

In the discussion, unless otherwise stated, adjectives such as "substantially", "relatively" and "about" modifying a condition or relationship characteristic of a feature or features of an embodiment of the invention, are understood to mean that the condition or characteristic is defined to within tolerances that are acceptable for operation of the embodiment for an application for which it is intended. Unless otherwise indicated, the word "or" in the specification and claims is considered to be the inclusive "or" rather than the exclusive "or", and indicates at least one of, or any combination of items it conjoins.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE FIGURES

Non-limiting examples of embodiments of the invention are described below with reference to figures attached hereto that are listed following this paragraph. Identical structures, elements or parts that appear in more than one figure are generally labeled with a same numeral in all the figures in which they appear. Dimensions of components and features shown in the figures are chosen for convenience and clarity of presentation and are not necessarily shown to scale.

DETAILED DESCRIPTION

Figure 1:
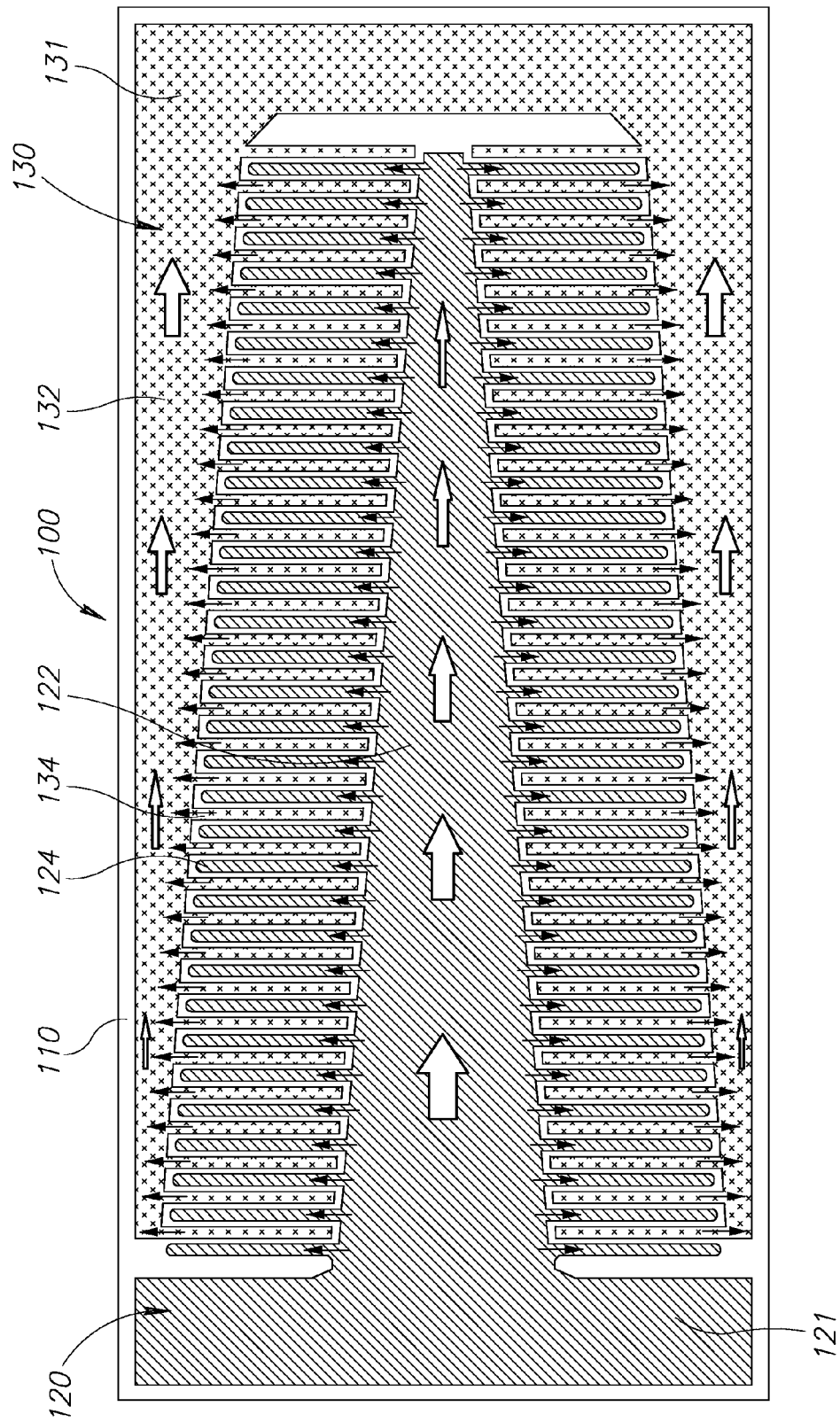
FIG. 1 schematically shows, in an overhead view, anode and cathode electrodes of a comb diode, in accordance with an embodiment of the invention.
Figure 2:
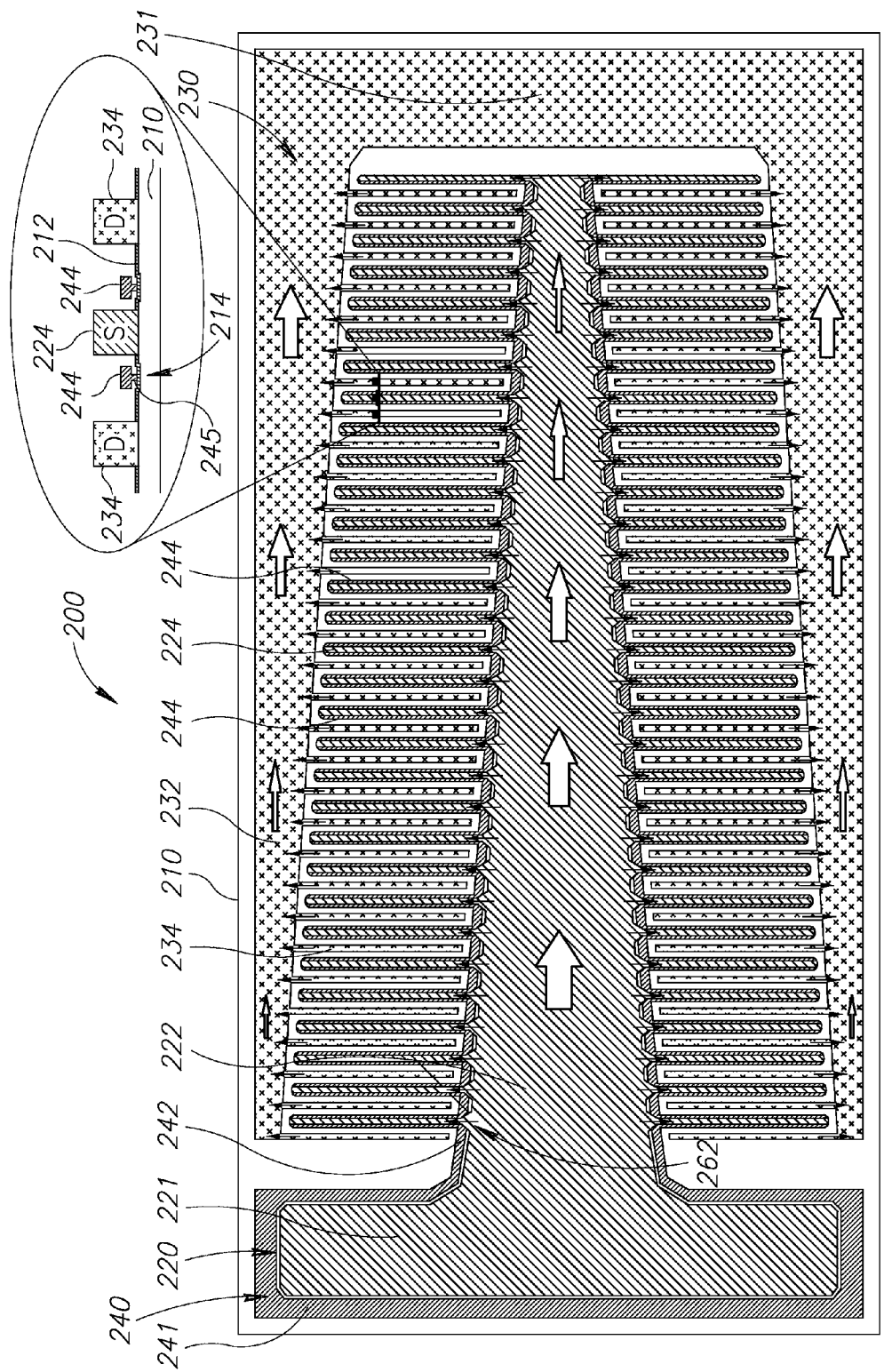
FIG. 2 schematically shows, in an overhead view, source, drain and gate electrodes of a comb FET, in accordance with an embodiment of the invention.
Figure 3:
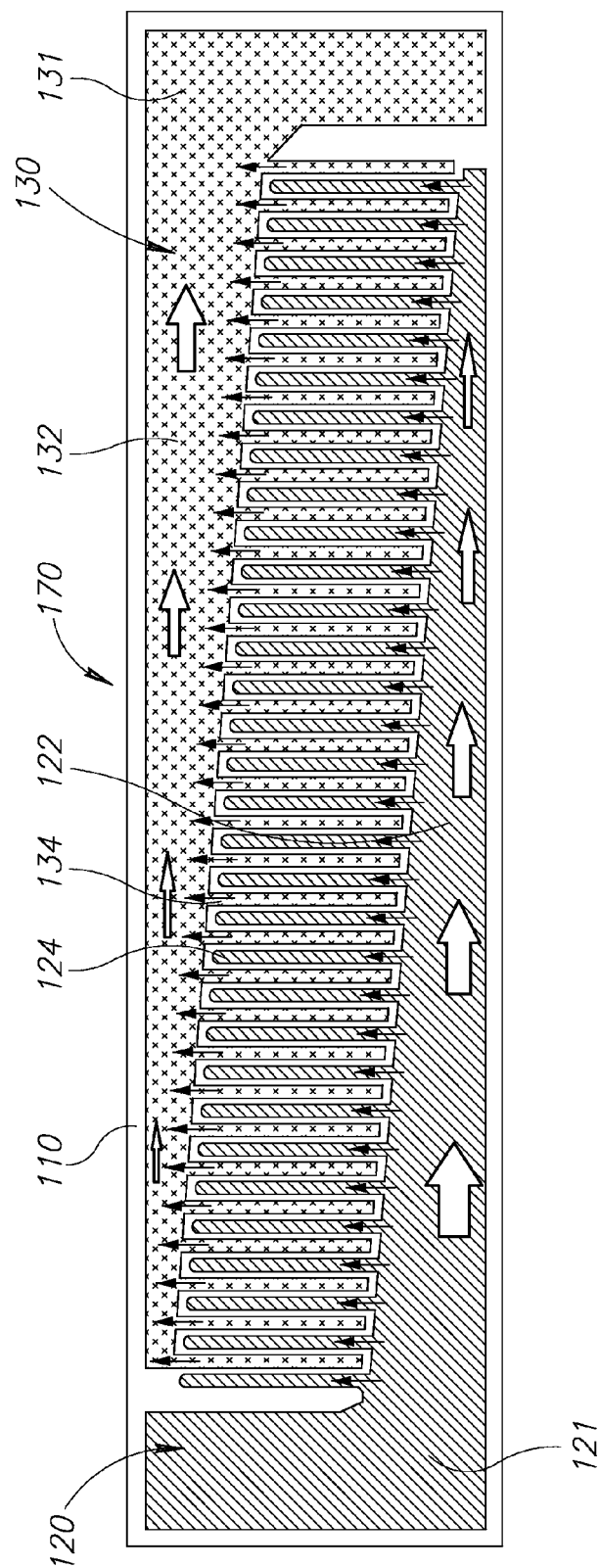
FIG. 3 schematically shows, in an overhead view, the electrodes of an alternative comb diode, in accordance with an embodiment of the invention.
Figure 4:
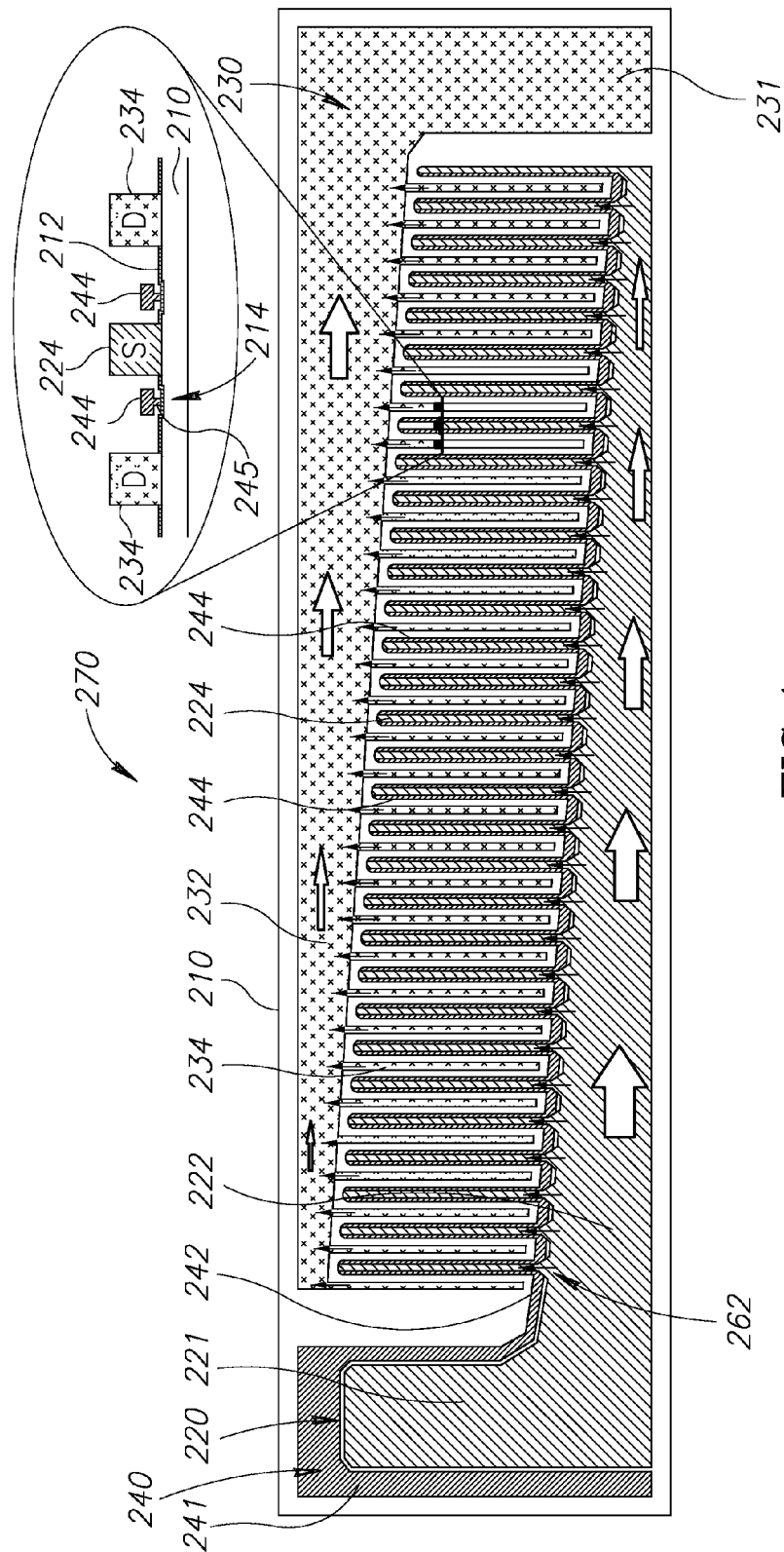
FIG. 4 schematically shows, in an overhead view, the electrodes of an alternative comb FET, in accordance with an embodiment of the invention.

In the following detailed description, the components of a comb diode in accordance with an embodiment of the invention are schematically illustrated in FIG. 1 and discussed with reference to that figure. The components of a comb FET in accordance with an embodiment of the invention are schematically illustrated in FIG. 2 and discussed with reference to that figure. An alternative comb diode and an alternative comb FET are schematically illustrated in FIGS. 3-4 and discussed with reference to those figures.

Reference is now made to FIG. 1 showing a schematic view of an exemplary comb diode 100 having an anode 120 ("comb anode") and cathode 130 ("comb cathode") formed on a semiconductor substrate 110. Substrate 110 may optionally comprise Si, SiC, GaAs, or GaN. The substrate may optionally be a layered substrate such as a GaN on Si wafer substrate or a GaN on SiC substrate. Comb anode 120 includes multiple conductive fingers 124 ("anode fingers") extending from each of two sides of a central anode busbar 122 in a "fishbone" configuration. Comb cathode 130 includes two cathode busbars 132 on each of the two sides of anode busbar 122 in a tongue-in-groove configuration. Multiple conductive fingers 134 ("cathode fingers") extend from each cathode busbar 132 and interleave with anode fingers 124. Comb anode 120 further includes an anode terminal 121 connected to one end of anode busbar 122 and comb cathode 130 further includes a cathode terminal 131 connected to one end of cathode busbar 132. Comb diode 100 is operable to pass an "ON current" between anode fingers 124 and cathode fingers 134 through a current path in the intervening semiconductor substrate when the comb diode is forward biased. Comb anode 120 and comb cathode 130 do not overlap or make contact with each other. In certain embodiments of the invention, anode fingers 124 and cathode fingers 134 may be on a same epitaxial layer on semiconductor substrate 110. In comb diode 100 as shown in FIG. 1, anode fingers 124 are schematically presented as having rounded ends while cathode fingers 134 are schematically presented as having cornered ends. This distinction is made to facilitate visually distinguishing the anode and cathode fingers, and is not intended to be limiting.

Comb anode 120 and comb cathode 130 may optionally comprise one or more of metals such as aluminum, gold, copper, nickel or titanium, or a combination thereof. The combination may be in the form of alloys. Alternatively, the combination may be multiple layers of different metals, which may be elemental metals or alloys. Various methods of applying patterned metal layers on semiconductor substrates are known in the art.

By convention, when comb diode 100 is forward biased, ON current flows from anode terminal 121 to cathode terminal 131. The ON current enters the comb diode from anode terminal 121, travels through anode busbar 122, enters anode fingers 124 and transfers to adjacent cathode fingers 134 through the intervening portion of semiconductor substrate 110, and continues through cathode busbars 132 to cathode terminal 131. The interleaved arrangement of the anode fingers and cathode fingers creates a large total perimeter available for current flow between anode 120 and cathode 130.

The white block arrows of varying sizes shown in FIG. 1 schematically show the direction and magnitude of ON current through the different electrode busbars of comb diode 100, and the small filled arrows schematically show the direction and magnitude of ON current through the electrode fingers. The different sizes of the white block arrows reflect the change in magnitude of the ON current as it travels through the busbars. As indicated by the white block arrows, the ON current through anode busbar 122 decreases along its length starting from anode terminal 121, as more of the ON current is diverted from anode busbar 122 through the interleaved conductive fingers to the cathode. Concurrently and as schematically indicated by the sizes of the white block arrows, the ON current through cathode busbar 132 increases along its length towards cathode terminal 131, as more ON current enters cathode busbar 132 from anode busbar 122 through the interleaved conductive fingers. As indicated by the identical small filled arrows, the ON current through each conductive finger 124, 134 may be of substantially the same magnitude.

According to an embodiment of the invention, the first and second busbars decrease in cross section in opposite directions. Along the current path, distance from the anode terminal is inverse to the distance from the cathode terminal. That is, as ON current flows away from the anode terminal, it flows towards the cathode terminal. Thus, in accordance with an embodiment of the invention, the cross section of each busbar decreases as it extends away from its respective terminal. In the convention of the ON current flowing from the anode terminal to the cathode terminal, the anode busbar cross-section decreases relative to the direction of ON current flow while the cathode busbar cross-section increases relative to the direction of ON current flow.

In accordance with an embodiment of the invention, each busbar may be shaped to change its cross section along its length to have the cross section be substantially proportional to the magnitude of ON current. Such proportional configuration serves to reduce changes in current density along length of the busbars despite the change in overall current. Reducing anode busbar cross-section in coordination with the reduction in ON current magnitude along its length serves to stabilize current density along the length of the anode busbar. Similarly, increasing the cross-section of the cathode busbar in coordination with the increase in ON current along its length serves to stabilize current density along the length of the cathode busbar. In certain embodiments of the invention, the current density may be substantially constant along the length of the busbars.

The change in current at each point along the busbar may be dependent on the magnitude of current flow through the conductive fingers. Accordingly, in certain embodiments of the invention, the shape of each busbar may depend on the resistance of the conductive fingers and the distribution of said conductive fingers along the busbars.

The change in cross-section may be gradual. Alternatively, the change in cross section may be in a stepwise manner, for example before, at, or after each conductive finger. In certain embodiments of the invention, the change in cross-section is substantially linear.

In certain embodiments of the invention, the change in the cross-section of the first and second busbars along their respective lengths is accomplished by a change in the width of the busbar while the thickness of the busbars remains substantially constant. Such a width-based change in busbar cross section is advantageous where the electrodes are formed as patterned thin metal layers of substantially uniform thickness on semiconductor substrate 110. Further, the width-based change in busbar cross section is advantageous where the ON current has a high frequency. Under high current frequencies, current flow tends to occur at or near the surface of the electrodes, and increasing electrode thickness is less effective in reducing current density compared to increasing electrode width.

Comb diode 100 having the anode and cathode busbars decrease in width, as provided in an embodiment of the invention, may advantageously cover a smaller surface area and allow more diodes to be fabricated per wafer compared to a conventional lateral diode having busbars of constant width. As discussed above, the total current along the busbars are highest toward the respective terminals, and the widths of the busbars of comb diode 100 are correspondingly widest where it is closest to its respective terminal. Constant-width busbars of an otherwise similarly configured conventional diode require the same width as the widest portion of the decreasing-width busbars of comb diode 100 in order to have a comparable current capacity and maximum current density. Thus, the decreasing-width busbars of comb diode 100, as provided in an embodiment of the invention, occupy a comparatively smaller surface area. Therefore, comb diode 100 as a whole may occupy a smaller surface area. Alternatively, a conventional diode with constant-width busbars that occupies the same total surface area as comb diode 100 may require that the anode and cathode fingers be shortened in order to accommodate the larger surface area occupied by the constant-width busbars, thus resulting in the conventional diode having a higher ON current resistance due to a smaller total perimeter available for current flow between the anode and cathode.

In certain embodiments of the invention, each anode finger 124 is substantially parallel with each other and each cathode finger 134 is substantially parallel with each other. Optionally, the conductive fingers may be connected to their respective busbars at a substantially perpendicular angle. Optionally, anode fingers 124 are substantially parallel to cathode fingers 134. Optionally, the sides of anode busbar 122 and cathode busbars 132 facing each other may be substantially parallel with each other.

According to an embodiment of the invention, each conductive finger may be substantially identical in size and shape. Each conductive finger may further be substantially identical in composition. Where each conductive finger is substantially identical in size, shape and composition, the resistance of each finger is typically also substantially identical.

In the exemplary comb diode of FIG. 1, the dimensions of the conductive fingers 124, 134 are substantially equal, the ON current through each conductive finger are substantially equal (as indicated by the identical small filled arrows), and conductive fingers 124, 134 extend from their respective busbars 122, 132 at regular intervals. In such a configuration of the conductive fingers, the current through anode busbar 122 decreases in a substantially linear manner along its length, in proportion to the distance from anode terminal 121. Similarly, the current through cathode busbar 132 decreases in a substantially linear manner along its length, in proportion to the distance from cathode terminal 131. In other words, the anode busbar cross-section decreases substantially linearly relative to the direction of ON current flow while the cathode busbar cross-section increases substantially linearly relative to the direction of ON current flow. Linearly changing the width of busbars 122, 132 along its length at a rate substantially equal to the change in the magnitude of the ON current, in accordance with an embodiment of the invention, serves to mitigate or substantially eliminate changes in current density along the length of the anode and cathode busbars. In certain embodiments of the invention, the current density in the anode and cathode busbars are substantially evenly distributed and substantially constant along the length of the busbar.

Further, in the exemplary comb diode 100 of FIG. 1, anode busbar 122 is parallel with cathode busbar 132 and conductive fingers 124, 134 extend perpendicularly from their respective busbars. Further, all of conductive fingers 124, 134 are substantially parallel with each other. In such a configuration, in accordance with an embodiment of the invention, the combined widths of the anode and cathode busbars at each point along the respective lengths of the busbars remain substantially constant.

In an alternative configuration of the comb diode, the ON current may flow in the opposite direction, with comb anode 120 serving as the cathode and comb cathode 130 serving as the anode, and with semiconductor substrate 110 appropriately configured.

Comb anode 120 and comb cathode 130 may also be advantageously incorporated in a lateral FET instead of a lateral diode. An exemplary lateral FET incorporating a source that is substantially identical to comb anode 120 and a drain that is substantially identical to comb cathode 130 is described in further detail with respect to FIG. 2.

Reference is now made to FIG. 2 showing a schematic view of an exemplary comb FET 200 having a source 220 ("comb source") and drain 230 ("comb drain") formed on a semiconductor substrate 210. Comb source 220 is substantially identical in structure to comb anode 120, having multiple conductive fingers 224 ("source fingers") extending from each of two sides of a central source busbar 222 in a "fishbone" configuration and a source terminal 221 connected to one end of source busbar 222. Comb drain 230 is substantially identical in structure to comb cathode 130, having two drain busbars 232 on each of the two sides of source busbar 222 in a tongue in groove configuration, with conductive fingers 234 ("drain fingers") extending from each of drain busbars 232 and a drain terminal 231 connected to one end of drain busbars 232. Busbars 222, 232 have the same configurations and properties as described above with respect to busbars 122, 132, respectively.

Comb FET 200 may further include a gate 240 ("comb gate") that includes two gate busbars 242 on each of the two sides of source busbar 222 and a drain terminal 241 connected to one end of drain busbars 242. Multiple conductive fingers 244 ("gate fingers") extend from each of gate busbars 242. Gate fingers 244 are arranged so that each gate finger 244 is situated between one source finger 224 and one drain finger 234.

The arrangement of gate fingers 244 with source fingers 224 and drain fingers 234 on substrate 210 is shown in greater detail in the inset of FIG. 2. In accordance with an embodiment of the invention, gate finger 244 is separate from, and do not make contact with, source finger 224 and drain finger 234. Gate finger 244 is optionally situated to be closer to source finger 224 than to drain finger 234. In certain embodiments of the invention, gate finger 244 is situated on an insulating layer 212 of semiconductor substrate 210. Gate finger 244 is optionally shaped as a "mushroom gate" (also referred to as a "tee gate") that includes a protruding spine ("gate contact bar") 245, which is narrower than the main body of the gate finger and runs along its longitudinal axis. Gate finger 244 optionally makes contact with insulating layer 212 through gate contact bar 245. Substrate 210 and insulating layer 212 are optionally configured to form trenches 214, and gate contact bar 245 is optionally situated within trench 214.

Comb FET 200 is capable of passing "ON current" between source fingers 224 and drain fingers 234 through a current path in the intervening semiconductor substrate when an appropriate voltage is applied to the gate fingers.

According to an embodiment of the invention, the base portion of source finger 224 proximal to source busbar 222 overlaps with gate busbar 242. The base portion of source finger 224, including at least the portion that overlaps with the gate busbar, may comprise an air bridge 262 that provides a gap between the gate busbar and the base portion of the source fingers so that the two electrodes overlap without making contact. Optionally, the base portion of source finger 224 may be higher or lower in relation to gate busbar 242 (not shown). Optionally, air bridge 262 is thinner than the rest of source finger 224 in order to provide the gap between the source finger and the gate busbar (not shown), and may also be wider than the rest of the source finger in order to mitigate the reduction in source finger cross-section and thus stabilize the current density at the air bridge. The overlapping but non-contacting portions of the source finger base portions and the gate busbar may be separated by an insulating structure (not shown).

Comb diode 100 has reflection symmetry, with the axis of symmetry being equivalent to the longitudinal axis of anode busbar 122. An aspect of an embodiment of the invention may also provide a non-symmetrical comb diode. An exemplary non-symmetrical comb diode is shown in FIG. 3, which schematically illustrates an alternative comb diode 170 that comprises substantially half of comb diode 100 on one side of its axis of symmetry.

Comb FET 200 also has reflection symmetry, with the axis of symmetry being equivalent to the longitudinal axis of source busbar 222. An aspect of an embodiment of the invention may also provide a non-symmetrical comb FET. An exemplary non-symmetrical comb FET is show in FIG. 4, which schematically illustrates an alternative comb FET 270 that comprises substantially half of comb FET 200 on one side of its axis of symmetry.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

Descriptions of embodiments of the invention in the present application are provided by way of example and are not intended to limit the scope of the invention. The described embodiments comprise different features, not all of which are required in all embodiments of the invention. Some embodiments utilize only some of the features or possible combinations of the features. Variations of embodiments of the invention that are described, and embodiments of the invention comprising different combinations of features noted in the described embodiments, will occur to persons of the art. The scope of the invention is limited only by the claims.

The invention claimed is:

1. A semiconductor device comprising:
   first and second electrodes comprising first and second busbars respectively, wherein said first and second busbars decrease in cross section in opposite directions with respect to each other; and
   a plurality of interleaving first and second conducting fingers that extend from the first and second busbars respectively,
   the device being operable to selectively be in an ON state and an OFF state and further operable to pass an ON current between the first and second electrodes when in the ON state, wherein the first busbar cross-section decreases relative to the direction of the ON current and the second busbar cross-section increases relative to the direction of the ON current.

2. The semiconductor device of claim 1, wherein the first and second busbar cross-sections are proportional to the magnitude of the ON current along the length of the respective busbars.

3. The semiconductor device of claim 2, wherein the current density of the ON current remains substantially constant along the length of the first and second busbars.

4. The semiconductor device of claim 1, wherein the sum of the cross sections of the first busbar and the second busbar remains substantially constant at each point along the length of the busbars.

5. The semiconductor device of claim 1, wherein the change in cross section of the first and second busbars along their respective lengths is substantially linear.

6. The semiconductor device of claim 1, wherein the change in cross section of the busbars is accomplished by a change in busbar width while busbar thickness remains substantially constant.

7. The semiconductor device of claim 1, wherein the first conducting fingers are substantially parallel to each other and the second conducting fingers are substantially parallel to each other.

8. The semiconductor device of claim 7, wherein the first and second conducting fingers are substantially parallel to each other.

9. The semiconductor device of claim 1, wherein the sides of the first and second busbars facing each other are substantially parallel to each other.

10. The semiconductor device of claim 1, wherein the first and second conducting fingers have substantially the same length.

11. The semiconductor device of claim 1, wherein the semiconductor device is a lateral diode.

12. A semiconductor device comprising:
first and second electrodes comprising first and second busbars respectively, wherein said first and second busbars decrease in cross section in opposite directions with respect to each other; and
a plurality of interleaving first and second conducting fingers that extend from the first and second busbars respectively,
wherein the first and second electrodes are on a same epitaxial layer of a semiconductor substrate and do not overlap with each other.

13. The semiconductor device of claim 12, wherein the semiconductor device is a lateral diode.

14. A semiconductor device comprising:
first and second electrodes comprising first and second busbars respectively, wherein said first and second busbars decrease in cross section in opposite directions with respect to each other;
a plurality of interleaving first and second conducting fingers that extend from the first and second busbars respectively; and
a plurality of third conducting fingers that extend from a third busbar and interleave with the first and second conductive fingers so that each third conducting finger is situated between one first conducting finger and one second conducting finger.

15. The semiconductor device of claim 14, wherein the third conductive fingers are substantially parallel with the first and second conductive fingers.

16. The semiconductor device of claim 15, wherein the third conductive fingers are situated to be closer to the first conductive fingers than the second conductive fingers.

17. The semiconductor device of claim 15, wherein the third conductive fingers comprise a protuberance along the longitudinal axis thereof on the side facing the semiconductor substrate.

18. The semiconductor device of claim 14, wherein the third busbar overlaps but does not make contact with the base portion of the first conductive fingers.

19. The semiconductor device of claim 18, wherein the third busbar and the base of the first conductive fingers are separated by an insulating layer.

20. The semiconductor device of claim 14, wherein the semiconductor device is a lateral FET.

* * * * *